United States Patent
Li et al.

(10) Patent No.: US 11,887,964 B1
(45) Date of Patent: Jan. 30, 2024

(54) WAFER-LEVEL HETEROGENEOUS DIES INTEGRATION STRUCTURE AND METHOD

(71) Applicant: ZHEJIANG LAB, Hangzhou (CN)

(72) Inventors: Shunbin Li, Hangzhou (CN); Weihao Wang, Hangzhou (CN); Ruyun Zhang, Hangzhou (CN); Qinrang Liu, Hangzhou (CN); Zhiquan Wan, Hangzhou (CN); Jianliang Shen, Hangzhou (CN)

(73) Assignee: ZHEJIANG LAB, Hangzhou (CN)

( * ) Notice: Subject to any disclaimer, the term of this patent is extended or adjusted under 35 U.S.C. 154(b) by 0 days.

(21) Appl. No.: 18/298,379

(22) Filed: Apr. 11, 2023

Related U.S. Application Data (63) Continuation of application No. PCT/CN2023/071482, filed on Jan. 10, 2023.

(30) Foreign Application Priority Data

Jul. 12, 2022 (CN) .......................... 202210812604.0

(51) Int. Cl.
*H01L 21/00* (2006.01)
*H01L 25/065* (2023.01)
(Continued)

(52) U.S. Cl.
CPC .... *H01L 25/0655* (2013.01); *H01L 21/30625* (2013.01); *H01L 21/486* (2013.01);
(Continued)

(58) Field of Classification Search
CPC ........... H01L 25/0655; H01L 21/30625; H01L 21/565; H01L 23/49822; H01L 23/49827;
(Continued)

(56) References Cited

U.S. PATENT DOCUMENTS 8,519,543 B1* 8/2013 Song ...................... H01L 24/17
257/774
2019/0312019 A1* 10/2019 Pietambaram ........ H01L 23/293
(Continued)

FOREIGN PATENT DOCUMENTS

CN 110797335 A 2/2020
CN 112349682 A 2/2021
(Continued)

OTHER PUBLICATIONS

International Search Report of PCT/CN2023/071482.
China Office Actions of 202210812604.0.

*Primary Examiner* — Nicholas J Tobergte (57) ABSTRACT

A wafer-level heterogeneous dies integration structure and method are provided. The integration structure includes a wafer substrate, a silicon interposer, heterogeneous dies, and a configuration substrate. A standard integration module is defined by the heterogeneous dies connected to the silicon interposer. The standard integration module is connected to an upper surface of the wafer substrate, and the configuration substrate is connected to a lower surface of the wafer substrate. The wafer substrate is connected to the configuration substrate via Through Silicon Vias on lower surface of the wafer substrate. And the upper surface of the wafer substrate is provided with Re-distributed Layers and a standardized micro bump array to form standard integration zone connected to the standard integration module.

9 Claims, 5 Drawing Sheets

(51) Int. Cl.
  *H01L 23/498* (2006.01)
  *H01L 23/538* (2006.01)
  *H01L 23/00* (2006.01)
  *H01L 21/48* (2006.01)
  *H01L 21/56* (2006.01)
  *H01L 21/306* (2006.01)

(52) U.S. Cl.
  CPC ...... *H01L 21/565* (2013.01); *H01L 23/49822* (2013.01); *H01L 23/49827* (2013.01); *H01L 23/49838* (2013.01); *H01L 23/5383* (2013.01); *H01L 24/16* (2013.01); *H01L 24/81* (2013.01); *H01L 2224/16235* (2013.01); *H01L 2224/81192* (2013.01); *H01L 2924/182* (2013.01)

(58) Field of Classification Search
  CPC ........... H01L 23/49838; H01L 23/5383; H01L 24/16; H01L 24/81; H01L 2224/16235; H01L 2224/81192; H01L 2924/182
  See application file for complete search history.

(56) References Cited

U.S. PATENT DOCUMENTS

2020/0006232 A1\* 1/2020 Pietambaram .......... H01L 25/50
2023/0343774 A1\* 10/2023 Pietambaram ...... H01L 23/5381

FOREIGN PATENT DOCUMENTS

| CN | 114899185 A | 8/2022 |
| JP | 2012064839 A | 3/2012 |

\* cited by examiner

WAFER-LEVEL HETEROGENEOUS DIES INTEGRATION STRUCTURE AND METHOD

CROSS-REFERENCE TO RELATED APPLICATIONS

This application a continuation of international patent application No. PCT/CN2023/071482, filed on Jan. 10, 2023, which itself claims priority to Chinese patent application No. 202210812604.0, filed on Jul. 12, 2022. The contents of the above identified applications are hereby incorporated herein in their entireties by reference.

TECHNICAL FIELD

The present disclosure relates to the field of integrated circuit, and in particular, to a wafer-level heterogeneous dies integration structure and method.

BACKGROUND

As integrated circuit industry enters the post-Moore's law era, advanced integrated package has gradually become a key point in semiconductor field. A variety of System on Chips (SoC) and System in Packages (SiP) emerged in the semiconductor field. For Chiplet, a plurality of chips and dies are packaged together with die-to-die interconnection, then forming a multi-functional heterogeneous SiP chip. In 2021, system integration has been further extended to wafer-level by TSMC. Integrated Fan Out_System on Wafer (InFO_SoW) technology was released. A wafer-level deep learning chip called Wafer scale engine (WSE) was released by Cerebras, and Tesla Tojo for high-performance artificial intelligence computing systems was released by SoW technology.

Different from Chiplet integration scale within 10 dies, SoW has a scale of integration with an integration number of dies greater than 50 on the wafer, so as to achieve ultra-high density integration, ultra-short signal transmission distance, and ultra-strong system processing performance. However, field-specific SoW system is usually integrated with homogeneous dies, such as Celebras WSE and Tesla Tojo, both of which are integrated with homogeneous high-performance computing units. Since limited by a patterning process of integrated circuit manufacturing, photomask cannot be frequently replaced during patterning process in foundry. At present, the maximum dimension of stepper mask for large-size wafer is 25.5×33 mm², so that repeating structural units are formed on wafer substrate, which is difficult to integrate heterogeneous dies on the wafer. Therefore, a wafer-level heterogeneous dies integration structure and method is urgently needed to meet the efficient and feasible heterogeneous integration on wafer.

SUMMARY

According to various embodiments of the present disclosure, a wafer-level heterogeneous dies integration structure is provided. The integration structure includes heterogeneous dies, a wafer substrate, and a configuration substrate connected in sequence. A standard integration module is defined by a set of heterogeneous dies connected to a silicon interposer, and a set of standard integration modules is connected to a standard integration zone cooperatively provided on the wafer substrate.

The silicon interposer is provided with heterogeneous micro bumps of the interposer on an upper surface thereof, and the micro bumps of the interposer are configured for bonding the heterogeneous dies. The silicon interposer is provided with standardized micro pads of the interposer on a lower surface thereof, and the standardized micro pads of the interposer are coordinated with the standard integration zones of the wafer substrate and configured for bonding the wafer substrate. The micro bumps of the interposer and the micro pads of the interposer are cooperatively connected with each other within the silicon interposer.

In some embodiments, a size of the wafer substrate is greater than or equal to 8-inch.

In some embodiments, the wafer substrate is provided with repeating arrays of standardized micro bumps on an upper surface thereof, and the repeating arrays of standardized micro bumps are configured for bonding the micro pads of the interposer. The micro bumps of the wafer substrate are led out from a lower surface of the wafer substrate via Through Silicon Vias (TSVs), the led out TSVs are attached to the configuration substrate via solder balls.

In some embodiments, the silicon interposer is provided with a plurality of Re-distributed Layers, which are configured to be connected to either or all of the heterogeneous dies and the wafer substrate. In some embodiments, the wafer substrate is provided with a plurality of Re-distributed Layers, which are configured to be connected to either or all of the silicon interposer and the configuration substrate.

A wafer-level heterogeneous dies integration method includes:

preparing a wafer substrate, including: disposing a TSV array on a wafer by a standard semiconductor process, constructing a micro bump array on an upper surface of the wafer based on the TSV array, and repeating a patterning process to form repeating standard integration zones on the wafer, to obtain the wafer substrate;

preparing a silicon interposer, including: disposing heterogeneous micro bumps of the interposer on an upper surface of the silicon interposer by a silicon interposer preparation process, the micro bumps of the interposer being configured for bonding heterogeneous dies; and disposing standardized micro pads of the interposer on a lower surface of the silicon interposer, the micro pads of the interposer being coordinated with the standard integration zones of the wafer substrate and configured for bonding the wafer substrate, and the micro bumps of the interposer and the micro pads of the interposer being cooperatively connected with each other within the silicon interposer;

bonding a set of the heterogeneous dies to the upper surface of the silicon interposer to form a standard integration module;

integrating a set of standard integration modules with the wafer substrate by Die to Wafer bonding to obtain a heterogeneous integration wafer; and attaching the heterogeneous integration wafer to a configuration substrate, to obtain a complete integrated structure of wafer-level heterogeneous dies integration.

In some embodiments, preparing the wafer substrate further includes: thinning a lower surface of the wafer substrate via chemical mechanical polishing by a backside via reveal process, so as to lead out the TSVs from the lower surface of the wafer substrate.

In some embodiments, the bonding the set of the heterogeneous dies to the upper surface of the silicon interposer to form the standard integration module further includes: bonding the set of the heterogeneous dies to the micro bumps of the interposer via micro pads of the heterogeneous dies on a lower surface of the heterogeneous dies.

In some embodiments, the silicon interposer is provided with a plurality of Re-distributed Layers, which are configured to be connected to either or all of the heterogeneous dies and the wafer substrate. In some embodiments, the wafer substrate is provided with a plurality of Re-distributed Layers, which are configured to be connected to either or all of the silicon interposer and the configuration substrate.

In some embodiments, the bonding the set of the heterogeneous dies to the upper surface of the silicon interposer to form the standard integration module further includes: bonding the set of the heterogeneous dies are bonded to the silicon interposer, after either or both of molding and grinding for thinning, to obtain the standard integration module.

In some embodiments, the integration method further includes molding an upper surface of the heterogeneous integration wafer, and bumping solder balls on the TSVs led out from a lower surface of the heterogeneous integration wafer. Solder balls of the TSVs are configured to be attached to the configuration substrate.

The details of one or more embodiments of the present disclosure are set forth in the accompanying drawings and the description below, so as to ensure that other features, objects and advantages of the present disclosure become apparent.

BRIEF DESCRIPTION OF THE DRAWINGS

To describe and illustrate embodiments and/or examples of the present disclosure made public here better, reference may be made to one or more of the figures. The additional details or embodiments used to describe the figures should not be construed as limiting the scope of any of the present disclosure, the embodiments and/or examples currently described, and the best model of the present disclosure as currently understood.

In the figures, 1 represents a heterogeneous die, 2 represents a silicon interposer, 3 represents a standard integration module, 4 represents a standard integration zone, 5 represents a Through Silicon Via, 6 represents a solder ball, 7 represents a Re-distributed Layer, 8 represents pads of a configuration substrate, 9 represents the configuration substrate, 10 represents a connector, 11 represents a power chip, 12 represents a silicon wafer, 13 represents a wafer substrate, 14 represents a micro bumps of the wafer substrate, 15 represents a micro pad of the interposer, 16 represents a micro bump of the interposer, 17 represents a micro pad of a die, 18a, 18b, 18c, and 18d represent different types of silicon interposers, respectively, and 19a, 19b, 19c, and 19d represent different types of heterogeneous dies, respectively.

DETAILED DESCRIPTION

To make purposes, technical solutions and advantages of the present disclosure clearer, the present disclosure is described and explained below with reference to the accompanying drawings and embodiments of the present disclosure. It should be understood that the specific embodiments described herein are only used to interpret the present disclosure and are not intended to limit the present disclosure. Based on the embodiments provided in the present disclosure, all other embodiments obtained by those of ordinary skill in the art without performing creative work fall within the scope of the present disclosure. Furthermore, it is also understood that although the efforts made in development process may be complex and lengthy, for ordinary persons skilled in the art related to the content disclosed in the present disclosure, some design, manufacturing or production variations based on the technical content disclosed in the present disclosure are only conventional technical means, and should not be understood as insufficient content disclosed in the present disclosure.

References to "embodiment" in the present application means that a particular feature, structure or property described in conjunction with the embodiment may be included in at least one embodiment of the present application. The occurrence of the phrase in various positions of the description does not necessarily refer to the same embodiment, nor is it a separate or alternative embodiment that is mutually exclusive with other embodiments. Those of ordinary skill in the art expressly and implicitly understand that the embodiments described in the present application may be combined with other embodiments without conflict.

Unless otherwise defined, all technical and scientific terms used herein have the same meaning as a skilled person in the art would understand. The term "one", "a", "an", "the" and other similar words as used in the present invention do not indicate quantitative limitations, and they can be singular or plural. The term "plurality" in the present disclosure refers to two or more. The terms "include", "comprise", "have", and any variation thereof, as used in the present invention, are intended to cover a non-exclusive inclusion.

The specific embodiments of the present disclosure are described in detail below with reference to the accompanying drawings. It should be understood that the specific embodiments described herein are only used to illustrate and interpret the present disclosure and are not intended to limit the present disclosure.

Figure 1:
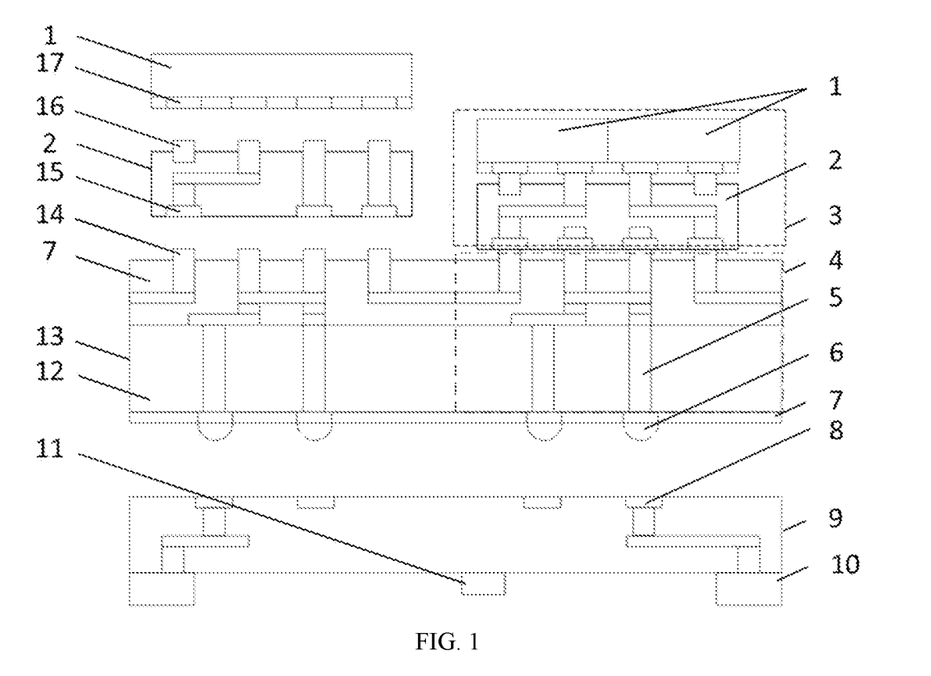
FIG. 1 is a sectional schematic view of a wafer-level heterogeneous dies integration structure in an embodiment of the present disclosure.

Referring to FIG. 1, a wafer-level heterogeneous dies integration structure includes heterogeneous dies 1, a wafer substrate 13, and a configuration substrate 9 connected in sequence. A standard integration module 3 is defined by a set of heterogeneous dies 1 connected to a silicon interposer 2, and a set of standard integration modules 3 is connected to a standard integration zone 4 cooperatively provided on the wafer substrate 13. Micro bumps 16 of the interposer and micro pads 15 of the interposer are cooperatively connected with each other within the silicon interposer 2.

The silicon interposer 2 is provided with heterogeneous micro bumps 16 of the interposer on an upper surface thereof, and the micro bumps 16 of the interposer are configured for bonding the heterogeneous dies 1. The silicon interposer 2 is provided with standardized micro pads 15 of the interposer on a lower surface thereof, and the standardized micro pads 15 of the interposer are coordinated with the standard integration zone 4 of the wafer substrate 13 and configured for bonding the wafer substrate 13. A plurality of Re-distributed Layers 7 is filled between the bonded silicon interposer 2 and the heterogeneous dies 1, and/or between the silicon interposer 2 and the wafer substrate 13.

Figure 2:
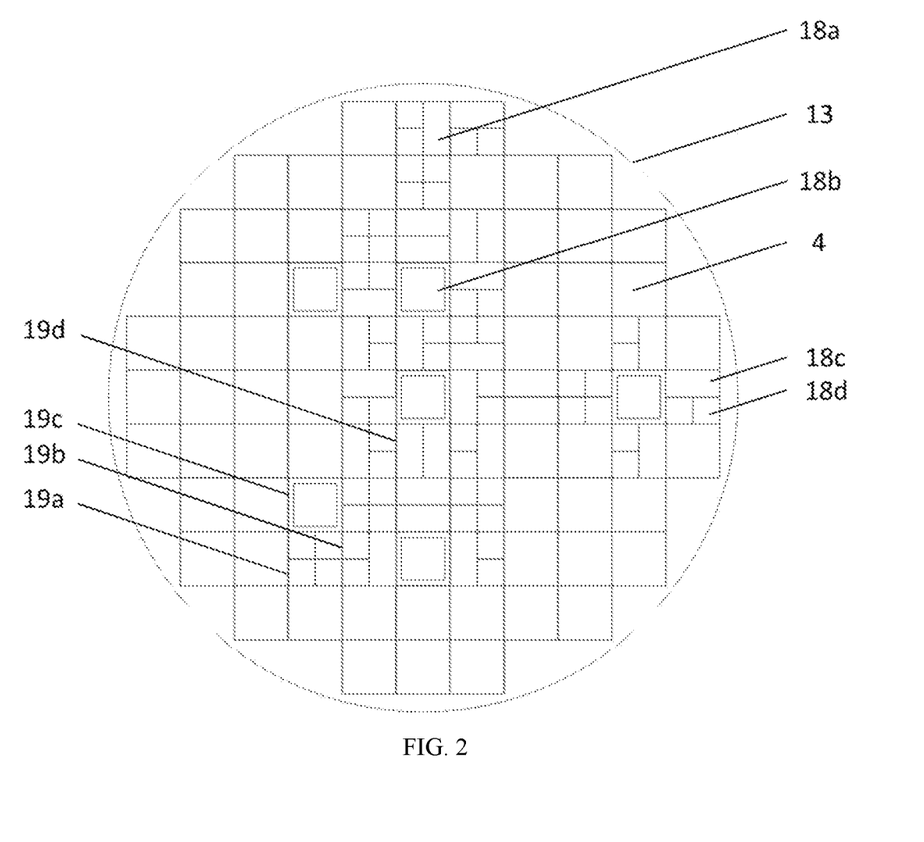
FIG. 2 is a top view of a wafer-level heterogeneous dies integration structure in an embodiment of the present disclosure.

In the present embodiment, referring to FIG. 1 and FIG. 2, an upper surface of the silicon interposer 2 may be connected to a set of heterogeneous dies 1. After a lower surface of the silicon interposer 2 is standardized, the lower surface of the silicon interposer 2 may be connected to the standard integration zone 4 cooperatively provided on an upper surface of the wafer substrate. The micro bumps 16 of the interposer on the upper surface of silicon interposer 2 can be varied to adapt to integration of various types of heterogeneous die on the silicon interposer, so as to form the standard integration module 3, thus normalizing a wafer preparation process. The micro pads 15 of the interposer on the lower surface of the silicon interposer 2 can be standardized, so that the wafer substrate of 13 provided with the standard integration zone 4 can be directly integrated with various standard integration modules 3 which are provided with various dies. The silicon interposer 2 is provided with heterogeneous micro bumps 16 of the interposer on the upper surface thereof, and the micro bumps 16 of the interposer are configured for bonding the heterogeneous dies 1. The micro pads 15 of the interposer on the lower surface of the silicon interposer is connected to the standard integration zone 4 of the wafer substrate. The micro pads 15 of the interposer on the lower surface of the silicon interposer 2 may not completely correspond to the arrays of standardized micro bumps on the wafer substrate 13. One or more heterogeneous dies 1 can be connected with each other and be connected with and in communication with the wafer substrate 13 by the silicon interposer 2 with a plurality of Re-distributed Layers 7. The silicon interposer 2 can be provided, so that the heterogeneous dies 1 in different sizes and shapes can be integrated on the wafer substrate 13 as required, and standard integration modules 3 with different functions can be integrated on the wafer substrate 13. Referring to FIG. 2, 18a, 18b, 18c, and 18d represent different types of silicon interposers 2, respectively, and 19a, 19b, 19c, and 19d represent different types of heterogeneous dies 1, respectively.

In this embodiment of the present disclosure, the silicon interposer 2 can be in four different types: a first silicon interposer, a second silicon interposer, a third silicon interposer, and a fourth silicon interposer. According to different types of heterogeneous dies 1 on the silicon interposer 2, the silicon interposer 2 can be further provided with heterogeneous preforms in four different types: a first heterogeneous preform, a second heterogeneous preform, a third heterogeneous preform, and a fourth heterogeneous preform.

The wafer substrate 13 can be provided with repeating arrays of standardized micro bumps on the upper surface thereof, and the repeating arrays of standardized micro bumps can be configured for bonding the micro pads 15 of the interposer. The micro bumps 14 of the wafer substrate can be led out from a lower surface of the wafer substrate 13 via Through Silicon Vias (TSVs) 5, the led out TSVs 5 can be attached to the configuration substrate 9 via solder balls 6.

In this embodiment of the present disclosure, the standard integration zone 4 can be defined by a plurality of Re-distributed Layers (RDL) and arrays of standardized micro bumps provided on the upper surface of the wafer substrate 13, and the standard integration zone 4 can be connected to the standard integration modules 3. The wafer substrate 13 can be provided with TSVs 5 on the lower surface thereof, and the solder balls 6 at an end of the TSVs 5 can be connected to the configuration substrate 9. Patterning processes such as repeating lithography etching technology can be applied to the wafer substrate to form repeating standard integration zones 4, and a range of the standard integration zone 4 can be not greater than a maximum zone of one lithography.

A size of the wafer substrate 13 can be greater than or equal to 8-inch. In the embodiment of the present disclosure, the wafer substrate 13 can include a silicon wafer 12 with a size of 12-inch. The stepping photoetching of a large-size and wafer-level wafer substrate 13 is difficult to integrate heterogeneous dies on the wafer. However, the present disclosure can enable the large-size and wafer-level wafer substrate 13 for to be integrated with heterogeneous dies 1.

The configuration substrate 9 can include a Printed Circuit Board (PCB) with functions such as chip configuration, test, clock, power supply and system configuration.

Figure 3:
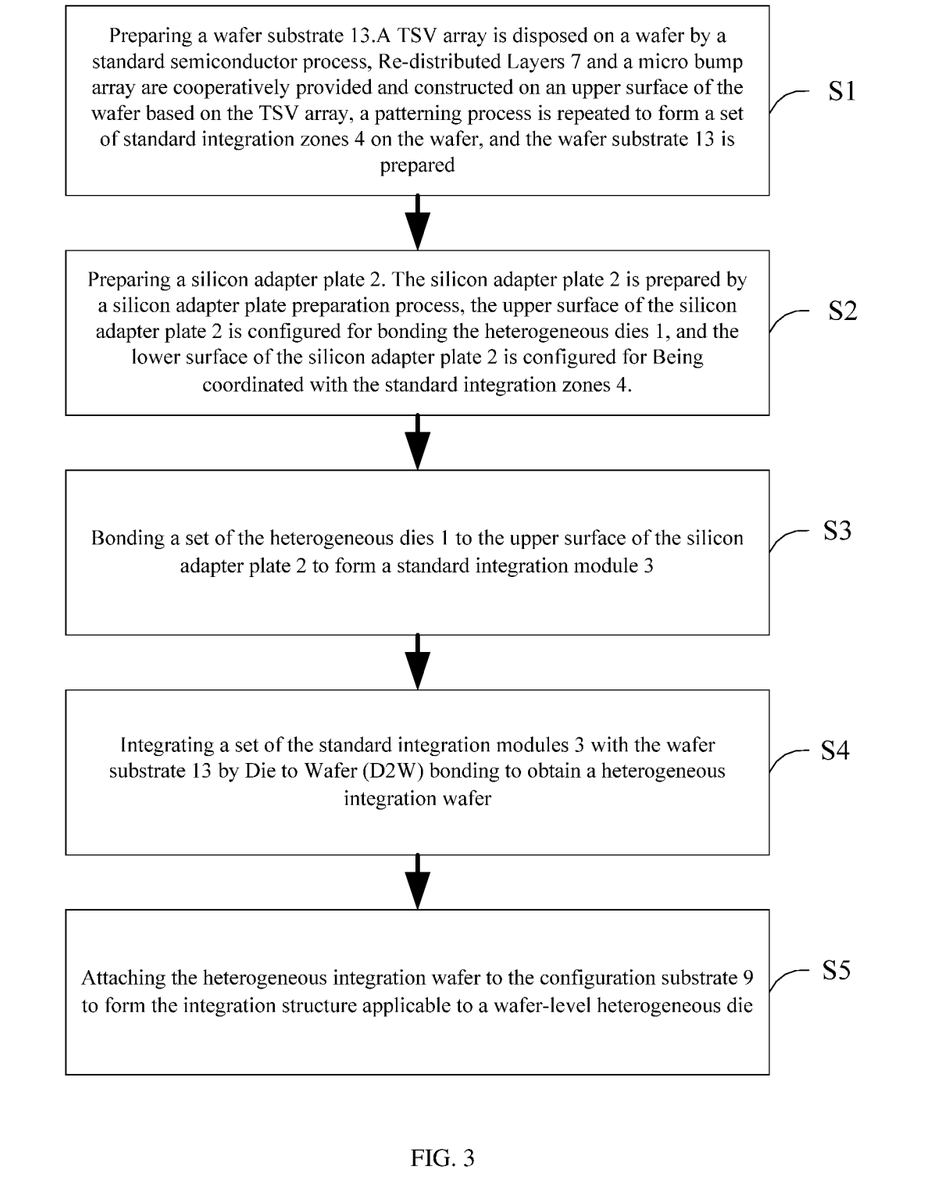
FIG. 3 is a flowchart view of a wafer-level heterogeneous dies integration method in an embodiment of the present disclosure.

An integration method applicable to a wafer-level heterogeneous die is provided. Referring to FIG. 3, the method includes the following Step 1 to Step 5.

Step 1 includes preparing a wafer substrate 13. A TSV array is disposed on a wafer by a standard semiconductor process, Re-distributed Layers 7 and a micro bump array are cooperatively provided and constructed on an upper surface of the wafer based on the TSV array, a patterning process is repeated to form a set of standard integration zones 4 on the wafer, and the wafer substrate 13 is prepared.

When preparing the wafer substrate, the method can further include thinning a lower surface of the wafer substrate 13 via chemical mechanical polishing (CMP) by a backside via reveal process (BVR), so as to enable the TSVs 5 to extend through Re-distributed Layers 7 on a lower surface of the wafer substrate 13, and lead out from the lower surface of the wafer substrate 13.

Figure 4:
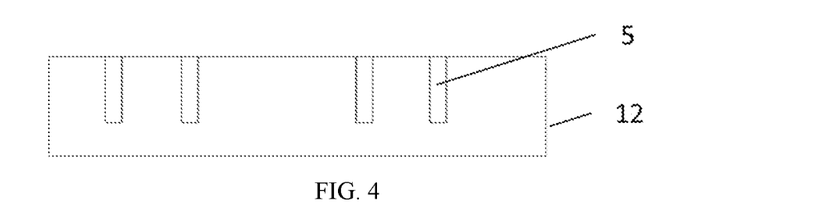
FIG. 4 is a schematic view of a silicon wafer in a wafer-level heterogeneous dies integration method in an embodiment of the present disclosure.
Figure 5:
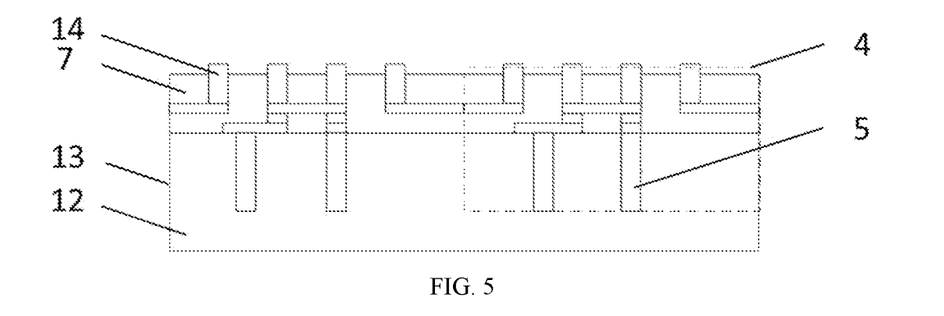
FIG. 5 is a schematic view of forming standard integration zones on a silicon wafer in a wafer-level heterogeneous dies integration method in an embodiment of the present disclosure.
Figure 6:
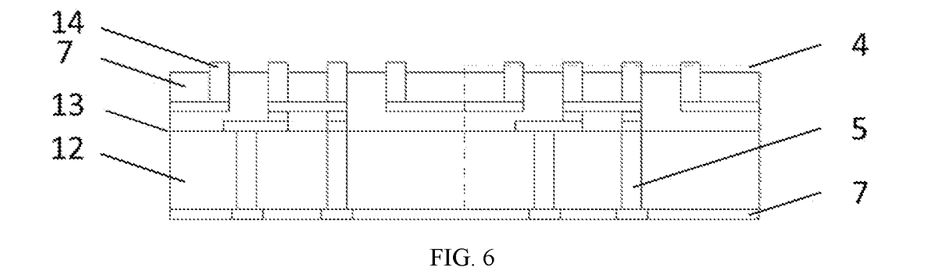
FIG. 6 is a schematic view of a wafer substrate in a wafer-level heterogeneous dies integration method in an embodiment of the present disclosure.

In this embodiment of the present disclosure, referring to FIG. 4, standard semiconductor processes such as deep etching, sputtering, and plating can be applied on the silicon wafer 12 to form the TSV array. Referring to FIG. 5, the standard semiconductor processes can be applied on an upper surface of the wafer to construct the Re-distributed Layers 7 and the micro bump array. The patterning process can be repeated to form the standard integration zones 4 on the wafer. Referring to FIG. 6, the method can include thinning a lower surface of the silicon wafer 12 via chemical mechanical polishing by the backside via reveal process, so as to enable the TSVs 5 to extend through Re-distributed Layers 7 on the lower surface of the silicon wafer 12, and lead out from the lower surface of the silicon wafer 12, and the wafer substrate 13 can be prepared.

Step 2 includes preparing a silicon interposer 2. The silicon interposer 2 is prepared by a silicon interposer preparation process, the upper surface of the silicon interposer 2 is configured for bonding the heterogeneous dies 1, and the lower surface of the silicon interposer 2 is configured for being coordinated with the standard integration zones 4.

Figure 7A:
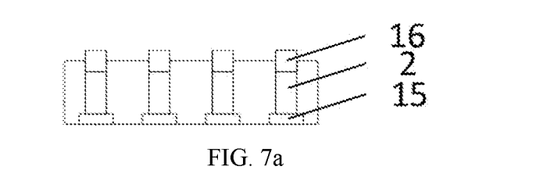
FIG. 7a is a schematic view of a first silicon interposer in a wafer-level heterogeneous dies integration method in an embodiment of the present disclosure.
Figure 7B:
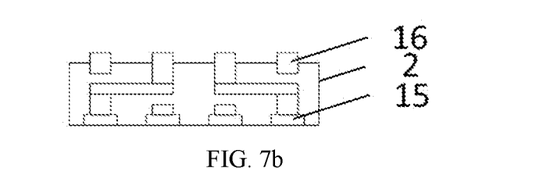
FIG. 7b is a schematic view of a second silicon interposer in a wafer-level heterogeneous dies integration method in an embodiment of the present disclosure.

Referring to FIG. 7a and FIG. 7b, micro bumps 16 of the interposer can be disposed on the upper surface of the silicon interposer 2, and the micro bumps 16 of the interposer are configured for bonding heterogeneous dies. The micro pads 15 of the interposer are disposed on the lower surface of the silicon interposer 2, coordinated with the micro bumps 14 of the wafer substrate. The micro bumps 16 of the interposer and the micro pads 15 of the interposer are cooperatively connected with each other within the silicon interposer 2. In some embodiments, when designing a wiring line according to chip functions, a direct connection may be applied to a single signal transmission, and in some other embodiments, a power signal transmission may be combined with the single signal transmission.

Step 3 includes bonding a set of the heterogeneous dies 1 to the upper surface of the silicon interposer 2 to form a standard integration module 3.

The heterogeneous dies 1 can be bonded to the micro bumps 16 of the interposer via micro pads 17 of the heterogeneous dies on a lower surface of the heterogeneous dies 1.

The Re-distributed Layers 7 can be filled around the micro pads of the dies 17 and the micro bumps 16 of the interposer.

The heterogeneous dies 1 can be bonded to the silicon interposer 2, after either or both of molding and grinding for thinning, the standard integration module 3 can be obtained.

Figure 8A:
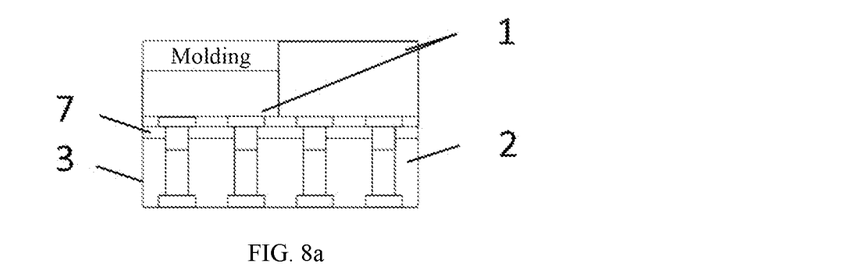
FIG. 8a is a schematic view of a first standard integration module in a wafer-level heterogeneous dies integration method in an embodiment of the present disclosure.
Figure 8B:
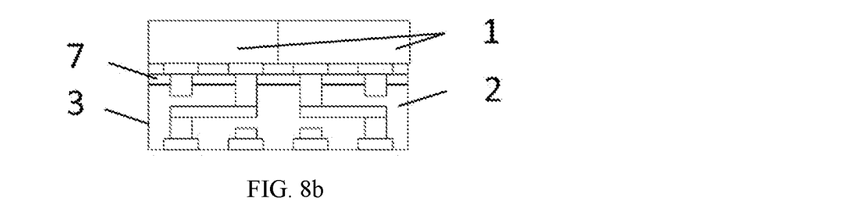
FIG. 8b is a schematic view of a second standard integration module in a wafer-level heterogeneous dies integration method in an embodiment of the present disclosure.

In this embodiment of the present disclosure, referring to FIG. 8a and FIG. 8b, a first heterogeneous die and a second heterogeneous die can be bonded to the first silicon interposer, which then can be grinded for thinning after molding, and a first standard integration module can be obtained. A third heterogeneous die and a fourth heterogeneous die can be bonded to the second silicon interposer, which then can be grinded for thinning after molding, and a second standard integration module can be obtained.

Step 4 includes integrating a set of the standard integration modules 3 with the wafer substrate 13 by Die to Wafer (D2 W) bonding to obtain a heterogeneous integration wafer.

An upper surface of the heterogeneous integration wafer can be molded, and solder balls 6 can be bumped on the TSVs 5 led out from a lower surface of the heterogeneous integration wafer. The Re-distributed Layers 7 can be filled around the solder balls 60.

Figure 9:
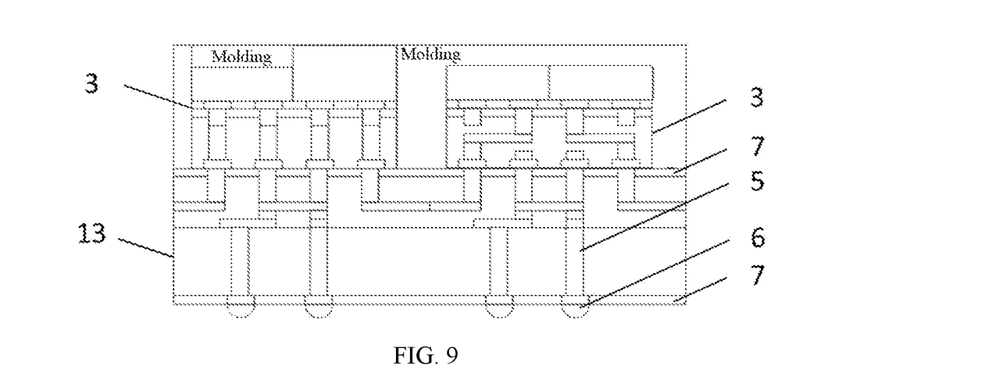
FIG. 9 is a schematic view of a heterogeneous integration wafer in a wafer-level heterogeneous dies integration method in an embodiment of the present disclosure.

Referring to FIG. 9, the first standard integration modules and the second standard integration modules can be integrated with the wafer substrate 13 by D2 W bonding to obtain the heterogeneous integration wafer. After molding a topside of the integrated heterogeneous integration wafer, the solder balls on the TSVs can be led out from a backside of the heterogeneous integration wafer. The solder balls can be configured to be attached to the configuration substrate 9. Solder balls can include laser solder balls, etc.

Figure 10:
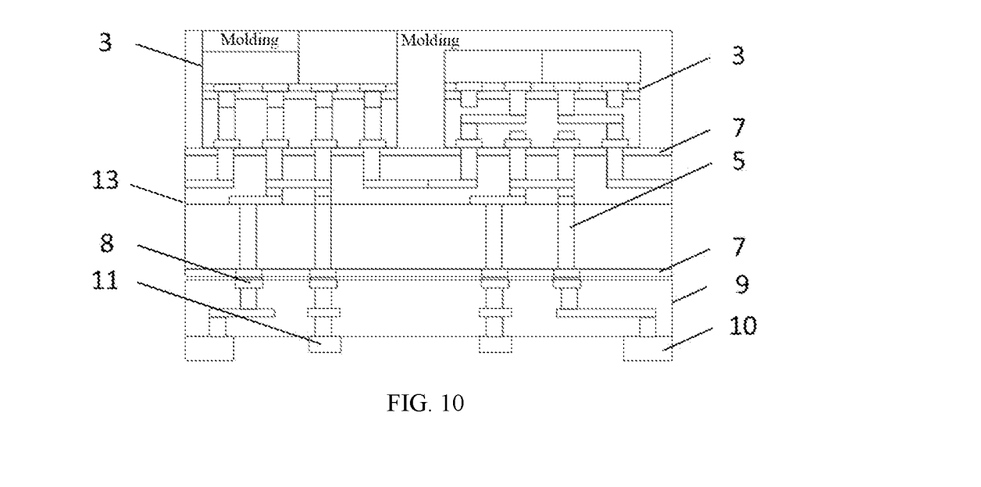
FIG. 10 is a schematic view of an integration structure applicable to wafer-level heterogeneous dies in a wafer-level heterogeneous dies integration method in an embodiment of the present disclosure.

Step 5 includes attaching the heterogeneous integration wafer to the configuration substrate 9 to form the integration structure applicable to a wafer-level heterogeneous die. Referring to FIG. 10, pads 8 of the configuration substrate can be attached to the solder balls 6, and a bottom of the configuration substrate 9 can be connected to a connector 10 and a power chip 11, etc.

In the present disclosure, a semiconductor manufacturing technology and a packaging technology can be applied to achieve integration of the wafer-level heterogeneous die. Flexible integration of the heterogeneous dies can be achieved based on a standardized wafer substrate, and a formed wafer system may be applied to various fields such as artificial intelligence, intelligent computing, high-performance computing, network switching on wafer, etc.

When a wafer substrate is manufactured in the present disclosure, the same lithographic mask plate can be applied to realize the grid unit to be integrated on the wafer, a problem can be solved that the photomask pattern cannot be frequently replaced during a wafer preparation process in a wafer factory. Therefore, an efficient and feasible technical guarantee can be provided in the integration of a wafer-level heterogeneous die.

In the present disclosure, without constraining the design of various heterogeneous dies, intercommunication and interconnection of various heterogeneous dies can be achieved only by forming a standard integration module via a specific silicon interposer.

The technical features of the above-described embodiments may be combined in any combination. For the sake of brevity of description, not all possible combinations of the technical features in the above embodiments are described. However, as long as there is no contradiction between the combinations of these technical features, all should be considered as within the scope of this disclosure.

The above-described embodiments are merely illustrative of several embodiments of the present disclosure, and the description thereof is relatively specific and detailed, but is not to be construed as limiting the scope of the disclosure. It should be noted that a number of variations and modifications may be made by those skilled in the art without departing from the spirit and scope of the disclosure. Therefore, the scope of the disclosure should be determined by the appended claims.

What is claimed is:

1. A wafer-level heterogeneous dies integration structure, comprising heterogeneous dies, a wafer substrate, and a configuration substrate connected in sequence,
   wherein a standard integration module is defined by a set of heterogeneous dies connected to a silicon interposer, a set of standard integration modules is connected to a standard integration zone cooperatively provided on the wafer substrate, and a size of the wafer substrate is greater than or equal to 8-inch;
   the silicon interposer is provided with heterogeneous micro bumps of the interposer on an upper surface thereof, and the micro bumps of the interposer are configured for bonding the heterogeneous dies;
   the silicon interposer is provided with standardized micro pads of the interposer on a lower surface thereof, and the standardized micro pads of the interposer are coordinated with the standard integration zone of the wafer substrate and configured for bonding the wafer substrate;
   the micro bumps of the interposer and the micro pads of the interposer are cooperatively connected with each other within the silicon interposer;
   when designing a wiring line according to chip functions in the silicon interposer, a direct connection is applied to a single signal transmission, or a power signal transmission is combined with the single signal transmission;

the silicon interposer has different types, the silicon interposer is further provided with heterogeneous preforms in different types according to different types of the heterogeneous dies; and a first heterogeneous die and a second heterogeneous die are bonded to a first silicon interposer, which is grinded for thinning after molding to obtain a first standard integration module;

a third heterogeneous die and a fourth heterogeneous die are bonded to a second silicon interposer, which is grinded for thinning after molding to obtain a second standard integration module.

2. The wafer-level heterogeneous dies integration structure of claim 1, wherein the wafer substrate is provided with repeating arrays of standardized micro bumps on an upper surface thereof, and the repeating arrays of standardized micro bumps are configured for bonding the micro pads of the interposer; and the micro bumps of the wafer substrate are led out from a lower surface of the wafer substrate via Through Silicon Vias, the led out Through Silicon Vias are attached to the configuration substrate via solder balls.

3. The wafer-level heterogeneous dies integration structure of claim 1, comprising either or both of the following structures:

the silicon interposer is provided with a plurality of Re-distributed Layers, which are configured to be connected to either or all of the heterogeneous dies and the wafer substrate; and the wafer substrate is provided with a plurality of Re-distributed Layers, which are configured to be connected to either or all of the silicon interposer and the configuration substrate.

4. A wafer-level heterogeneous dies integration method, comprising:

preparing a wafer substrate, comprising:
disposing a Through Silicon Via array on a wafer by a standard semiconductor process,
constructing a micro bump array on an upper surface of the wafer based on the Through Silicon Via array, and
repeating a patterning process to form repeating standard integration zones on the wafer, to obtain the wafer substrate, wherein a size of the wafer substrate is greater than or equal to 8-inch;

preparing a silicon interposer, comprising:
disposing heterogeneous micro bumps of the interposer on an upper surface of the silicon interposer by a silicon interposer preparation process, wherein the micro bumps of the interposer are configured for bonding heterogeneous dies; and
disposing standardized micro pads of the interposer on a lower surface of the silicon interposer, wherein the micro pads of the interposer are coordinated with the standard integration zones of the wafer substrate, and configured for bonding the wafer substrate; and the micro bumps of the interposer and the micro pads of the interposer are cooperatively connected with each other within the silicon interposer; and
when designing a wiring line according to chip functions in the silicon interposer, applying a direct connection to a single signal transmission, or combining a power signal transmission with the single signal transmission;

wherein the silicon interposer has different types, the silicon interposer is further provided with heterogeneous preforms in different types according to different types of the heterogeneous dies:

bonding a set of the heterogeneous dies to the upper surface of the silicon interposer to form a standard integration module, wherein a first heterogeneous die and a second heterogeneous die are bonded to a first silicon interposer, which is grinded for thinning after molding to obtain a first standard integration module; a third heterogeneous die and a fourth heterogeneous die are bonded to a second silicon interposer, which is grinded for thinning after molding to obtain a second standard integration module;

integrating a set of standard integration modules with the wafer substrate by Die to Wafer bonding to obtain a heterogeneous integration wafer; and attaching the heterogeneous integration wafer to a configuration substrate.

5. The wafer-level heterogeneous dies integration method of claim 4, wherein the preparing the wafer substrate further comprises:

thinning a lower surface of the wafer substrate via chemical mechanical polishing by a backside via reveal process, so as to lead out Through Silicon Vias from the lower surface of the wafer substrate.

6. The wafer-level heterogeneous dies integration method of claim 4, wherein the bonding the set of the heterogeneous dies to the upper surface of the silicon interposer to form the standard integration module further comprises:

bonding the set of the heterogeneous dies to the micro bumps of the interposer via micro pads of the heterogeneous dies on a lower surface of the heterogeneous dies.

7. The wafer-level heterogeneous dies integration method of claim 4, comprising either or both of the following structures:

the silicon interposer is provided with a plurality of Re-distributed Layers, which are configured to be connected to either or all of the heterogeneous dies and the wafer substrate; and the wafer substrate is provided with a plurality of Re-distributed Layers, which are configured to be connected to either or all of the silicon interposer and the configuration substrate.

8. The wafer-level heterogeneous dies integration method of claim 4, wherein the bonding the set of the heterogeneous dies to the upper surface of the silicon interposer to form the standard integration module further comprising:

bonding the set of the heterogeneous dies to the silicon interposer, after either or both of molding and grinding for thinning, to obtain the standard integration module.

9. The wafer-level heterogeneous dies integration method of claim 4, further comprising:

molding an upper surface of the heterogeneous integration wafer, and bumping solder balls on the Through Silicon Vias led out from a lower surface of the heterogeneous integration wafer, wherein solder balls of the Through Silicon Vias are configured to be attached to the configuration substrate.

* * * * *